United States Patent
Liu et al.

(10) Patent No.: US 12,321,134 B2
(45) Date of Patent: Jun. 3, 2025

(54) DISPLAY DEVICE AND HOLOGRAPHIC DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Yi Liu, Beijing (CN); Xibin Shao, Beijing (CN); Lingdan Bo, Beijing (CN); Yingying Qu, Beijing (CN); Dongchuan Chen, Beijing (CN); Zhe Li, Beijing (CN); Peng Li, Beijing (CN); Yanping Liao, Beijing (CN); Seungmin Lee, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 296 days.

(21) Appl. No.: 17/915,520

(22) PCT Filed: Nov. 16, 2021

(86) PCT No.: PCT/CN2021/130924
§ 371 (c)(1),
(2) Date: Sep. 29, 2022

(87) PCT Pub. No.: WO2022/217913
PCT Pub. Date: Oct. 20, 2022

(65) Prior Publication Data
US 2023/0229111 A1 Jul. 20, 2023

(30) Foreign Application Priority Data
Apr. 12, 2021 (CN) .......................... 202110391627.4

(51) Int. Cl.
*G03H 1/02* (2006.01)
*G02F 1/13357* (2006.01)
*G03H 1/00* (2006.01)

(52) U.S. Cl.
CPC ........ *G03H 1/024* (2013.01); *G02F 1/133621* (2013.01); *G02F 2203/50* (2013.01); *G03H 2001/0088* (2013.01); *G03H 2222/31* (2013.01)

(58) Field of Classification Search
CPC ........... G03H 1/024; G03H 2001/0088; G03H 2222/31; G02F 1/133621; G02F 2203/50
(Continued)

(56) References Cited

U.S. PATENT DOCUMENTS

2013/0050409 A1* 2/2013 Li .................... G03H 1/2294
977/932
2017/0276998 A1 9/2017 Hai
(Continued)

FOREIGN PATENT DOCUMENTS

CN 105319766 A 2/2016
CN 105892075 A 8/2016
(Continued)

*Primary Examiner* — Allen C Wong
(74) *Attorney, Agent, or Firm* — Chiwin Law LLC

(57) ABSTRACT

The disclosure provides a display device and a holographic display apparatus. The display device includes a display panel including a first linear polarizer located on a light-emitting side, so that the display panel emits linearly polarized image light; and a phase modulation panel disposed on the light-emitting side of the display panel and configured to perform phase modulation on the linearly polarized image light. The holographic display apparatus includes the display device.

14 Claims, 4 Drawing Sheets

(58) Field of Classification Search
USPC .......................................................... 348/40
See application file for complete search history.

(56) References Cited

U.S. PATENT DOCUMENTS

| | | | |
|---|---|---|---|
| 2019/0196403 A1 | 6/2019 | Guan et al. | |
| 2020/0292812 A1* | 9/2020 | Kollin | G09G 3/001 |
| 2021/0027677 A1* | 1/2021 | Jiang | H10K 50/86 |
| 2021/0223634 A1* | 7/2021 | Zhou | G02F 1/133531 |

FOREIGN PATENT DOCUMENTS

| | | |
|---|---|---|
| CN | 106154798 A | 11/2016 |
| CN | 215006256 U | 12/2021 |
| KR | 20140050904 A | 4/2014 |

* cited by examiner

DISPLAY DEVICE AND HOLOGRAPHIC DISPLAY APPARATUS

This application is a U.S. National Phase Entry of International Application No. PCT/CN2021/130924, filed on Nov. 16, 2021, designating the United States of America and claiming priority to Chinese Patent Application No. 202110391627.4, filed on Apr. 12, 2021. The present application claims priority to and the benefit of the above-identified applications and the above-identified applications are incorporated by reference herein in their entirety.

TECHNICAL FIELD

The disclosure relates to a display device and a holographic display apparatus comprising the display device.

BACKGROUND

A holographic 3D display technology can completely record and reconstruct a waveform of a 3D object, providing all depth perception required by the human visual system. The basic mechanism of the holographic 3D display technology is that an amplitude and a phase of light wave of the object are simultaneously recorded by a light wave interference method, and a reproduced image has same three-dimensional properties as the original object. According to holographic technology, amplitude information and phase information of the object light wave can be completely recorded by interference of reference light wave and the object light wave, and diffraction of illumination light wave by such a recorded interference pattern (for example, a hologram) can reproduce the image of the original object. A holographic recording process is highly redundant, and therefore has three-dimensional visual properties of the reproduced image.

SUMMARY

One of the objects of embodiments of the present disclosure is to provide a display device and a holographic display apparatus comprising the display device. The display device can synchronously adjust and express an amplitude and a phase, and realize a three-dimensional (3D) display with high resolution and high definition. In addition, the display device can increase a screen size for holographic display, and has a simple structure and a low cost.

At least one embodiment of the disclosure provides a display device. The display device comprises: a display panel, comprising a first linear polarizer located on a light-emitting side, so that the display panel emits linearly polarized image light; and a phase modulation panel, disposed on the light-emitting side of the display panel and configured to perform phase modulation on the linearly polarized image light.

In some examples, the display panel comprises a plurality of pixel units arranged in an array, the phase modulation panel comprises a plurality of phase modulation units arranged in an array, each phase modulation unit of the plurality of phase modulation units corresponds to at least one pixel unit, so as to modulate phase of the linearly polarized image light emitted by the at least one pixel unit corresponding thereto.

In some examples, the plurality of phase modulation units and the plurality of pixel units are in a one-to-one correspondence.

In some examples, the phase modulation panel comprises a first liquid crystal layer, and each phase modulation unit of the plurality of phase modulation units comprises a modulation electrode, which is configured to drive liquid crystal deflection in the first liquid crystal layer to achieve modulation of the phase of the linearly polarized image light passing through the first liquid crystal layer.

In some examples, the plurality of pixel units comprise pixel units that emit light of a same color.

In some examples, the plurality of pixel units comprise pixel units that emit light of different colors, and the pixel units that emit light of different colors correspond to different phase modulation units.

In some examples, the display panel comprises a liquid crystal display panel, the liquid crystal display panel comprises a second linear polarizer and a second liquid crystal layer, the second linear polarizer is disposed on an opposite side of the first linear polarizer, and the second liquid crystal layer is sandwiched between the first linear polarizer and the second linear polarizer.

In some examples, an absorption axis of the first linear polarizer and an absorption axis of the second linear polarizer are perpendicular to each other.

In some examples, the first liquid crystal layer comprises at least one selected from the group consisting of nematic liquid crystal, cholesteric liquid crystal and smectic liquid crystal.

In some examples, the second liquid crystal layer comprises at least one selected from the group consisting of nematic liquid crystal, cholesteric liquid crystal and smectic liquid crystal.

In some examples, at least one phase modulation unit of the plurality of phase modulation units is configured to be independently controlled.

In some examples, each phase modulation unit of the plurality of phase modulation units is configured to be independently controlled.

At least one embodiment of the disclosure provides a holographic display apparatus, comprising the display device according to any one of the items as mentioned above.

In some examples, the holographic display apparatus further comprises a controller, connected with the display panel and the phase modulation panel, respectively, and configured to provide the display panel with an intensity modulation control signal and provide the phase modulation panel with a phase modulation control signal.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
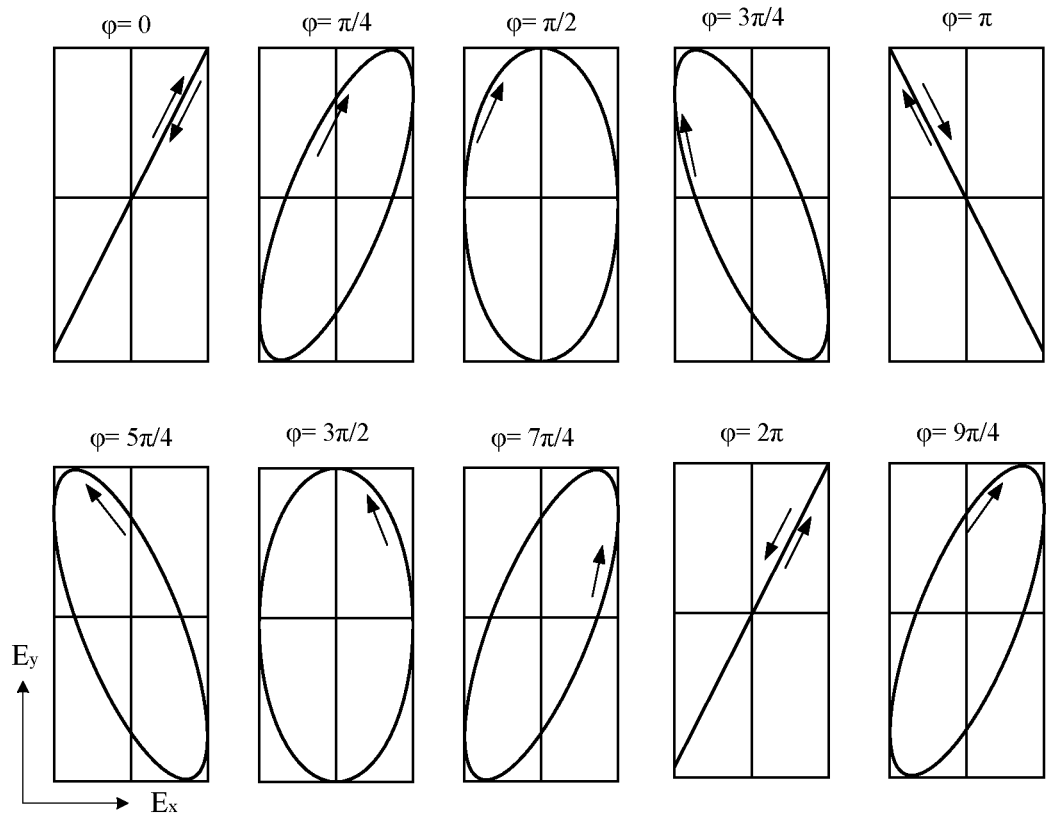
FIG. 1 is a schematic diagram illustrating each polarization state of light wave and corresponding phase difference.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terminology or scientific terminology used herein should have the general meanings understood by those skills in the art to which the present disclosure belongs. The "first", "second" and similar words used in the present invention application specification and claims do not mean any sequence, amount or importance, but are merely used to distinguish different components. Likewise, "a" or "an" or similar words do not mean the limitation to amount. The word "comprise", "include" or the like only indicates that an element or a component before the word contains elements or components listed after the word and equivalents thereof, not excluding other elements or components. The words "connection", "connected" and the like are not limited to physical or mechanical connection as illustrate in the drawings but may include equivalent connection, either directly or indirectly. The words "on", "beneath", "left", "right" and the like only indicate the relative position relationship which is correspondingly changed when the absolute position of a described object is changed.

In addition to a traditional method of simultaneously recording amplitude and phase of an object light wave using a light wave interference method, a computer holography technology has been developed. In some techniques, a scanner or a digital camera can be used to collect data for an object that actually exists, while for an object that does not actually exist, a functional form of the object can be directly input into a computer, and then a distribution image of interference fringes of an object light wave and a reference light wave can be calculated by the computer. In other techniques, after an interference hologram is obtained, reference light is generated by computer simulation, and the hologram is reconstructed and imaged by using a relevant algorithm (for example, the angular spectrum algorithm, etc.), amplitude information and phase information of the object are obtained, and then a 3D model of the object is reconstructed in the computer without coherent optical demodulation. This technique is usually called digital holographic reconstruction, which can directly obtain a complex amplitude distribution of the reproduced image of the recorded object, and further obtain the amplitude information and phase information of the object light wave, respectively.

Light wave is a transverse electromagnetic wave, and a vibration direction of its light vector is perpendicular to a propagation direction of the light wave. In a plane perpendicular to the propagation direction of the light wave, the vibration direction of the light wave is asymmetric relative to the propagation direction of the light wave, which causes properties of light wave to change with different vibration directions of the light wave, and this asymmetric property is called polarization property of the light wave. According to different trajectories of a vector end of a photoelectric field at any point in space at different times, polarization state of the light wave can be divided into a linear polarization, a circular polarization and an elliptical polarization.

Assuming that the light wave propagates in a z direction, its electric field vector can be expressed as: $E=E_0 \cos(\omega t - kz + \varphi_0)$.

In order to characterize the polarization property of the light wave, an electric field vector of the light wave can be expressed as a linear combination of two independent components vibrating in an x direction and a y direction, namely, $E=iE_x + jE_y$, wherein $E_x = E_{0x} \cos(\omega t - kz + \varphi_x)$, $E_y = E_{0y} \cos(\omega t - kz + \varphi_y)$.

By an operation of eliminating t of the above formula, the following is obtained:

$$\left(\frac{E_x}{E_{0x}}\right)^2 + \left(\frac{E_y}{E_{0y}}\right)^2 - 2\left(\frac{E_x}{E_{0x}}\right)\left(\frac{E_y}{E_{0y}}\right)\cos\varphi = \sin^2\varphi,$$

wherein $\varphi = \varphi_y - \varphi_x$ is a phase difference.

A difference of the phase difference $\varphi$ and an amplitude ratio $E_y/E_x$ determines the different polarization states of the light wave. As illustrated in FIG. 1, the polarization states corresponding to different $\varphi$ values are different. In the case where the phase difference of the two components of $E_y$ and $E_x$ is $\varphi = m\pi$ ($m=0, \pm 1, \pm 2, \ldots$), the light wave is linear polarization light. In the case where the amplitudes of the components $E_y$ and $E_x$ are equal, that is, $E_{0y} = E_{0x}$, and the phase difference $\varphi = m\pi/2$ ($m=\pm 1, \pm 3, \pm 5 \ldots$), the light wave is circular polarization light. In other cases, the light wave is elliptical polarization light.

Therefore, a change in the polarization state of the light wave is related to a change in the phase difference of the two components of the light wave. In addition, because liquid crystal can be deflected according to a voltage applied to it, which can be used to change the phase difference of light wave passing therethrough. Based on this, the inventors realized that the phase and the amplitude of light can be adjusted separately through reasonable configuration, thereby realizing a holographic three-dimensional display.

A display device is provided according to at least some embodiments according to the present disclosure. The display device comprises: a display panel comprising a first linear polarizer located on a light-emitting side, so that the display panel emits linearly polarized image light; and a phase modulation panel, disposed on the light-emitting side of the display panel and is configured to perform phase modulation on the linearly polarized image light. The display device according to an embodiment of the present disclosure performs intensity modulation of light through the display panel, so that a specific pattern can be formed for image display; in addition, the phase of image light emitted by the display panel is modulated through the phase modulation panel, so that the image light comprises both intensity information and phase information, so that a holographic three-dimensional image can be displayed.

Figure 2:
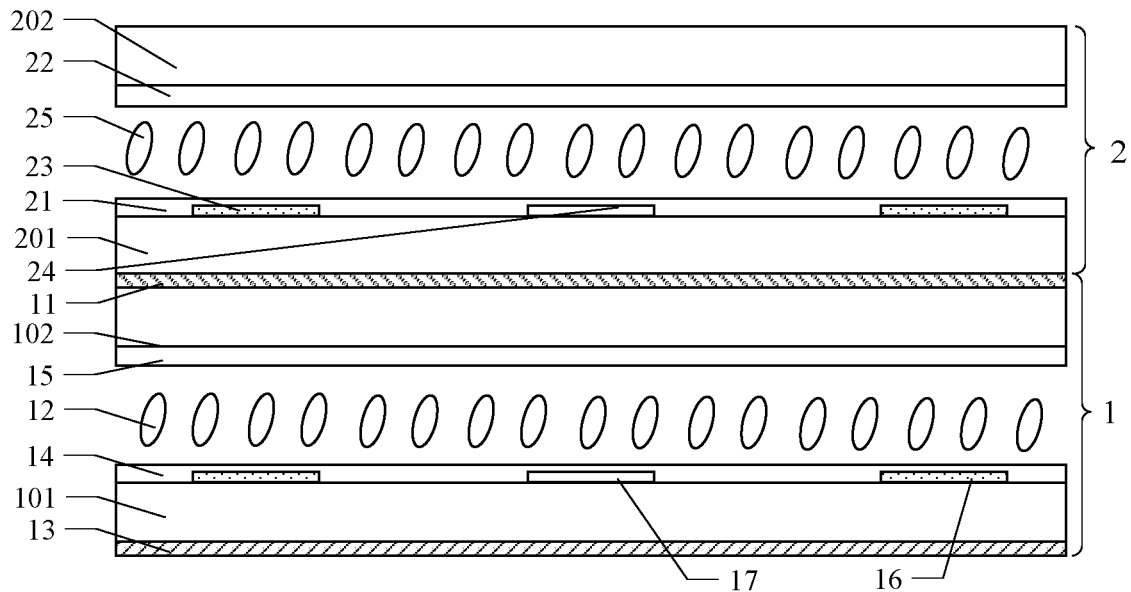
FIG. 2 is a cross-sectional view of a display device according to an embodiment of the present disclosure.

FIG. 2 is a cross-sectional view of the display device according to an embodiment of the present disclosure. The display device comprises a display panel 1 and a phase modulation panel 2. For example, the display panel 1 and the phase modulation panel 2 are stacked on each other. A light-emitting surface of the display panel 1 and a light-incident surface of the phase modulation panel 2 face each other, so that the image light emitted from the display panel 1 after the intensity modulation enters the phase modulation panel through the light-incident surface of the phase modulation panel, and the phase modulation panel performs the phase modulation on the entered image light, and therefore the light emitted from the phase modulation panel comprises both intensity information and phase information.

The display panel 1 is configured to modulate the amplitude of the light wave, that is, to modulate the intensity of the light wave. For example, the display panel 1 is a liquid crystal display panel. As illustrated in FIG. 2, the display panel 1 comprises a first linear polarizer 11 on a light-emitting side, so that the image light emitted from the display panel 1 is linearly polarized light whose polarization direction is consistent with a transmission axis of the first linear polarizer 11.

For example, as illustrated in FIG. 2, the display panel 1 comprises a second linear polarizer 13, a first substrate 101, a pixel electrode 16 and a common electrode 17, a first alignment layer 14 located on the pixel electrode 16 and the common electrode 17, a liquid crystal layer 12, a second alignment layer 15, a second substrate 102, and the first linear polarizer 11. For example, the pixel electrode 16, the common electrode 17 and the first alignment layer 14 are formed on the first substrate 101, and the second alignment layer 15 is formed on the second substrate 102. The second linear polarizer 13 and the first linear polarizer 11 are disposed on opposite sides of the first substrate 101 and the second substrate 102, respectively.

For example, the first substrate 101 and the second substrate 102 may be transparent glass substrates, respectively. However, embodiments according to the present disclosure are not limited thereto, and the first substrate 101 and the second substrate 102 may also be any suitable substrates such as transparent plastic substrates.

Materials of the first alignment layer 14 and the second alignment layer 15 may comprise polyimide (PI). However, embodiments according to the present disclosure are not limited thereto, as long as the first alignment layer 14 and the second alignment layer 15 have an initial alignment function for the liquid crystal in the liquid crystal layer 12, the first alignment layer 14 and the second alignment layer 15 may comprise any suitable material or prepared by any suitable process.

In the embodiment illustrated in FIG. 2, both the pixel electrode 16 and the common electrode 17 are formed on the first substrate 101. However, embodiments according to the present disclosure are not limited thereto, one of the pixel electrode 16 and the common electrode 17 may be formed on the first substrate 101, and the other of the pixel electrode 16 and the common electrode 17 may be formed on the second substrate 102. As long as the pixel electrode 16 and the common electrode 17 can apply an electric field to the liquid crystal in the liquid crystal layer to control a rotation (or a deflection) of the liquid crystal, the pixel electrode 16 and the common electrode 17 may adopt any suitable configuration. For example, in the case where the common electrode 17 is formed on the second substrate 102, the common electrode 17 may be an entire-surface electrode.

In the embodiment illustrated in FIG. 2, the first linear polarizer 11 is formed on a side of the second substrate 102 away from the liquid crystal layer 12, and the second linear polarizer 13 is formed on a side of the first substrate 101 away from the liquid crystal layer 12. However, embodiments according to the present disclosure are not limited thereto, and at least one of the second linear polarizer 13 and the first linear polarizer 11 may be formed between the first substrate 101 and the second substrate 102, as long as the second linear polarizer 13 and the first linear polarizer 11 are disposed on two sides of the liquid crystal layer 12, respectively.

Figure 3:
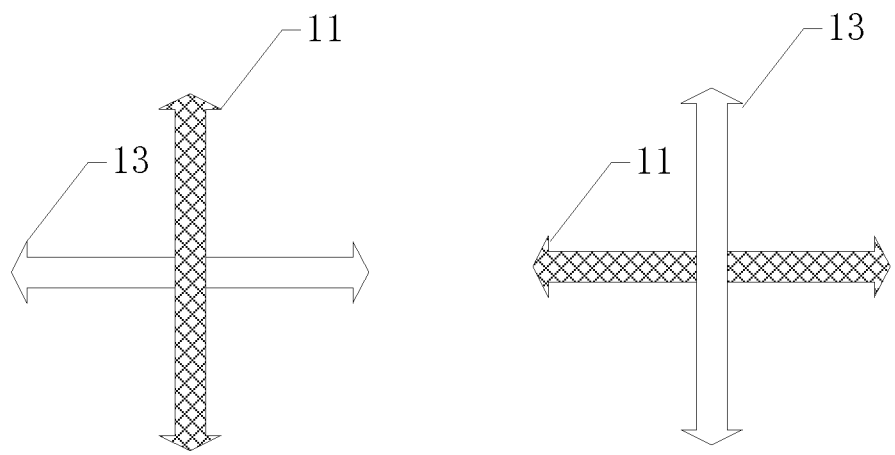
FIG. 3 is a schematic diagram of an arrangement of a linear polarizer of a display device according to an embodiment of the present disclosure.

As illustrated in FIG. 3, an absorption axis of the first linear polarizer 11 and an absorption axis of the second linear polarizer 13 are perpendicular to each other. For example, as illustrated in a left diagram in FIG. 3, the absorption axis of the first linear polarizer 11 may extend in a vertical direction in FIG. 3, and the absorption axis of the second linear polarizer 13 may extend in a horizontal direction in FIG. 3. Alternatively, as illustrated in a right diagram in FIG. 3, the absorption axis of the first linear polarizer 11 may extend in the horizontal direction in FIG. 3, and the absorption axis of the second linear polarizer 13 may extend in the vertical direction in FIG. 3. FIG. 3 only illustrates the case where the absorption axis of the first linear polarizer 11 and the absorption axis of the second linear polarizer 13 are perpendicular to each other, but embodiments according to the present disclosure are not limited thereto, the absorption axis of the first linear polarizer 11 and the absorption axis of the second linear polarizer 13 may also be parallel to each other or at other suitable angles.

Figure 4:
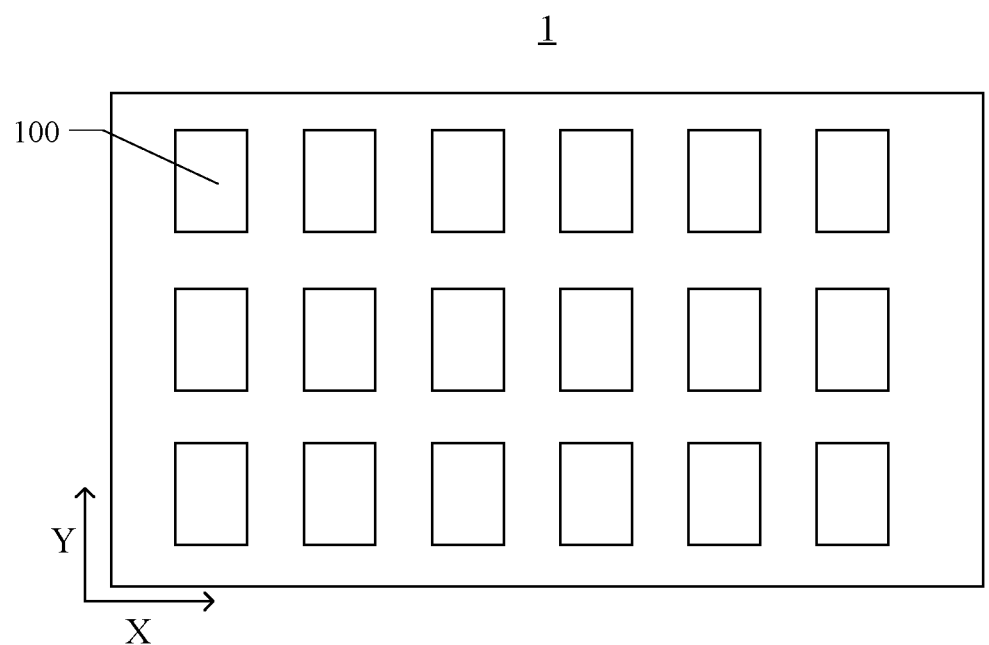
FIG. 4 is a schematic plan view of a display panel of a display device according to an embodiment of the present disclosure.

FIG. 4 is a schematic plan view of the display panel 1. As illustrated in FIG. 4, the display panel 1 comprises a plurality of pixel units 100 arranged in an array. Each pixel unit of the plurality of pixel units 100 can independently modulate image light emitted from the pixel unit. It can be seen from FIG. 4 that the plurality of pixel units are sequentially arranged along a row direction (X direction) and a column direction (Y direction) to form a two-dimensional matrix. Each pixel unit modulates intensity of corresponding image light, and can emit image light with pattern information for the image display. Combined with FIG. 2 and FIG. 4, each pixel unit 100 may comprise a pixel electrode 16, and the pixel electrode 16 and the common electrode 17 cooperate with each other to control a deflection of a liquid crystal corresponding to the pixel unit 100. It should be noted that a two-dimensional array arrangement illustrated in FIG. 4 in which the pixel units are arranged sequentially along the row direction and the column direction is only exemplary, and any suitable array arrangement may be adopted for the plurality of pixel units in the display panel 1.

During display, light wave incident from the light-incident surface of the display panel 1 (a surface on a lower side of the display panel 1 in FIG. 2) is converted into linearly polarized light through the second linear polarizer 13, and its vibration direction is perpendicular to the absorption axis of the second linear polarizer 13. Then, the linearly polarized light is incident into the liquid crystal layer 12. The linearly polarized light enters the first linear polarizer 11 after being modulated by the liquid crystal layer 12. Based on different arrangement states of the liquid crystals in the liquid crystal layer, a polarization direction of the linearly polarized light is changed. At the first linear polarizer 11, intensity of light emitted from the first linear polarizer 11 is determined based on a relationship between the polarization direction of the light and the direction of the absorption axis of the first linear polarizer 11. In each pixel unit, by applying a predetermined electric field between the pixel electrode and the common electrode, the liquid crystal in the pixel unit is rotated to a specific direction, thereby a polarization state of the linearly polarized light transmitted through the liquid crystal layer 12 is changed. The modulated linearly polarized light is converted into another linearly polarized light through the first linear polarizer 11, whose vibration direction is perpendicular to the absorption axis of the first linear polarizer 11. For different pixel units, according to image information to be displayed, different voltages can be applied through the pixel electrode and the common electrode, so that deflection degrees of liquid crystals in different pixel units are different, and the polarization direction of linearly polarized light is further changed differently. Furthermore, the intensity of light transmitted through the first linear polarizer 11 is different. Therefore, the display panel 1 can modulate the intensity of light through different pixel units, so as to emit the linearly polarized image light to perform image display.

In addition, although not illustrated in detail in figures, in order to perform a color display, color filters of different colors may be provided in the plurality of pixel units. For example, the plurality of pixel units may comprise pixel units of different colors, and pixel units of each color may comprise color filters of corresponding color, so that pixel units of different colors emit light of different colors. For example, the pixel units of different colors may comprise red pixel units, green pixel units, and blue pixel units. However, the embodiments according to the present disclosure are not limited thereto, for example, the pixel units may further comprise a white pixel unit (no color filter is provided), or the pixel units of different colors comprise pixel units with other color combinations, so that the display panel 1 can perform the color display.

With reference to FIG. 1, it can be known that starting from a linearly polarized light, in the case where deflections of liquid crystals corresponding to different pixel units are different, polarization states of light are changed so that they are continuously changed under various polarization states in the elliptical polarized light, the circular polarized light, and elliptical polarized light, the linearly polarized light, the elliptical polarized light, the circular polarized light, the elliptical polarized light, and the linearly polarized light. Upon passing through the linear polarizer 11 with a determined absorption axis direction, the polarized light with different polarization states modulated through the liquid crystal layer can pass through the linear polarizer 11 with different ratios, resulting in that intensities of the image light emitted from respective pixel units are different. Combining the above formula for the relationship between the polarization direction and the phase, it can be known that after passing through the liquid crystal layer, the linear polarizer sheet 13 and the linear polarizer 11 of the display panel, light waves emitted from the display panel 1 are linearly polarized light with the same phase. Therefore, it provides a basis for the next step to perform the phase modulation on the image light emitted from the display panel 1 through the phase modulation panel to obtain a predetermined phase.

The phase modulation panel 2 is configured to perform the phase modulation on the light wave. For example, as illustrated in FIG. 2, the phase modulation panel 2 comprises a third substrate 201, a modulation electrode 23 and a common electrode 24, a third alignment layer 21, a liquid crystal layer 25, a fourth alignment layer 22 and a fourth substrate 202 in an order from a bottom to a top in the FIG. 2. The modulation electrode 23 and the common electrode 24 are formed on the third substrate 201, the third alignment layer 21 is formed on the third substrate 201 on which the modulation electrode 23 and the common electrode 24 are formed, and the fourth alignment layer 22 is formed on the fourth substrate 202. A side of the third substrate 201 on which the third alignment layer 21 is formed and a side of the fourth substrate 202 on which the fourth alignment layer 22 is formed face each other. The liquid crystal layer 25 is sandwiched between the third alignment layer 21 and the fourth alignment layer 22.

For example, the modulation electrode 23 and the common electrode 24 may be applied with different voltages, respectively, thereby forming an electric field therebetween for driving deflections of liquid crystals in the liquid crystal layer. For example, the modulation electrode 23 is used for driving deflections of the liquid crystals in the liquid crystal layer 25 to modulate a phase of image light passing through the liquid crystal layer 25, for example, may cooperate with the common electrode 24 to generate an electric field for driving deflections of the liquid crystals.

Figure 5:
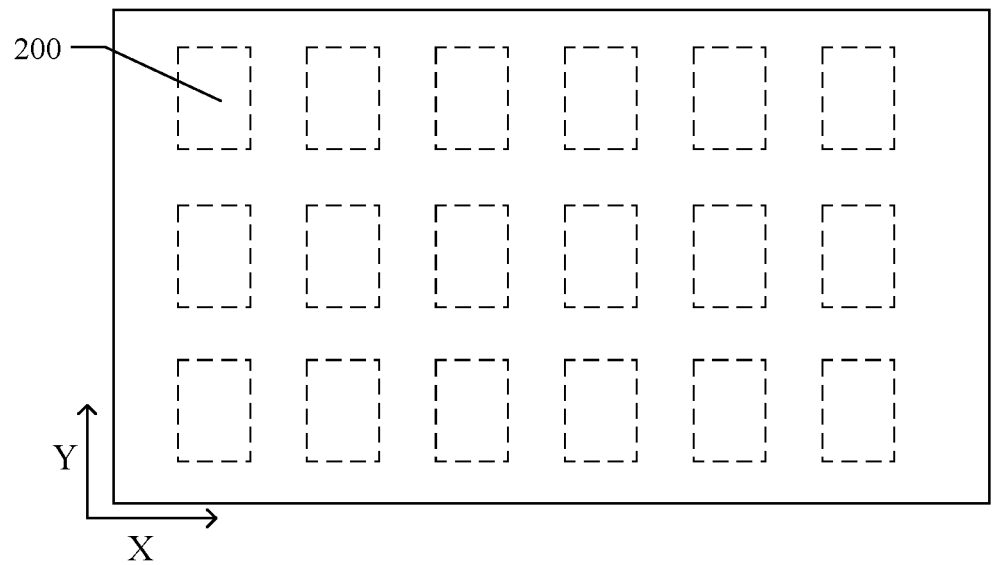
FIG. 5 is a schematic plan view of a phase modulation panel of a display device according to an embodiment of the present disclosure.

The phase modulation panel may comprise a plurality of phase modulation units arranged in an array. Each phase modulation unit can independently modulate the phase of the image light emitted from the phase modulation unit. It can be seen from FIG. 5 that the plurality of phase modulation units 200 are sequentially arranged along the row direction (X direction) and the column direction (Y direction) to form a two-dimensional array. Each phase modulation unit 200 modulates phase of the corresponding image light, so that phase information can be added to the image light with intensity information, thereby performing the holographic three-dimensional display. Combined with FIG. 2 and FIG. 5, each phase modulation unit 200 may comprise a modulation electrode 23, and the modulation electrode 23 and the common electrode 24 cooperate with each other to control the deflection of the liquid crystal corresponding to the phase modulation unit 200. It should be noted that a two-dimensional array arrangement illustrated in FIG. 5 in the row direction and the column direction is only exemplary, and any suitable array arrangement may be adopted for the plurality of phase modulation units in the phase modulation panel.

For example, the third substrate 201 and the fourth substrate 202 may be transparent glass substrates, respectively. However, embodiments according to the present disclosure are not limited thereto, and the third substrate 201 and the fourth substrate 202 may also be any suitable substrates such as transparent plastic substrates.

Materials of the third alignment layer 21 and the fourth alignment layer 22 may comprise polyimide (PI). However, embodiments according to the present disclosure are not limited thereto, as long as the third alignment layer 21 and the fourth alignment layer 22 have an initial alignment function for the liquid crystal in the liquid crystal layer 25, the third alignment layer 21 and the fourth alignment layer 22 may comprise any suitable material or prepared by any suitable process.

In the embodiment illustrated in FIG. 2, the modulation electrode 23 and the common electrode 24 in the phase modulation panel are both formed on the third substrate 201. However, the embodiments according to the present disclosure are not limited thereto, one of the modulation electrode 23 and the common electrode 24 may be formed on the third substrate 201, and the other of the modulation electrode 23 and the common electrode 24 may be formed on the fourth substrate 202. As long as the modulation electrode 23 and the common electrode 24 can apply an electric field to the liquid crystal in the liquid crystal layer to control the deflection of the liquid crystal, the modulation electrode 23 and the common electrode 24 may adopt any suitable configuration. For example, in the case where the common electrode 24 is formed on the fourth substrate 202, the common electrode 24 may be an entire-surface electrode.

Figure 6:
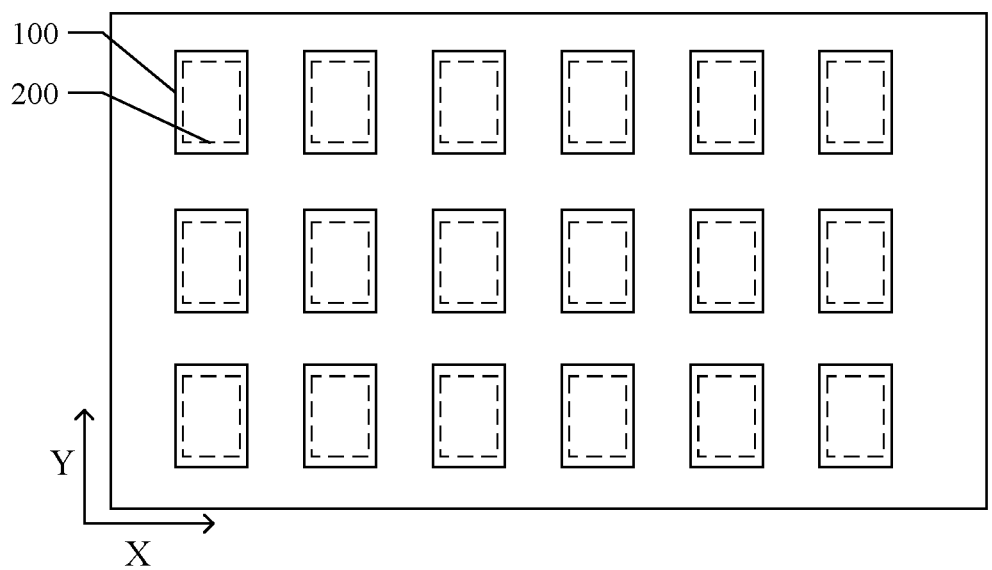
FIG. 6 is a schematic plan view of a display apparatus according to an embodiment of the present disclosure.

For example, the phase modulation panel 2 can be understood as a liquid crystal display panel without two polarizers. For the phase modulation panel, because the two polarizers are removed, the phase modulation panel cannot modulate the intensity of incident light, but can only modulate the phase of the polarized light passing through the liquid crystal layer, so that phase information is added on the image light with intensity information to obtain the image light with both the intensity information and the phase information, thereby realizing the holographic three-dimensional display. In addition, the phase modulation panel 2 has no color filter layer, and therefore the phase modulation panel does not affect the color of the image light emitted from the display panel 1. FIG. 6 is a schematic diagram illustrating a plane distribution relationship between the pixel units in the display panel and the phase modulation units in the phase modulation panel. It can be seen from FIG. 6 that the plurality of pixel units 100 in the display panel 1 are in a one-to-one correspondence with the plurality of phase modulation units 200 in the phase modulation panel 2. For example, each pixel unit 100 substantially overlaps with a corresponding phase modulation unit. For example, an orthographic projection of each pixel unit 100 on a plane parallel to the display panel is substantially consistent with an orthographic projection of the corresponding phase modulation unit 200 on the plane parallel to the display panel. Through this arrangement manner, the image light emitted from each pixel unit 100 can enter the corresponding phase modulation unit 200 for phase modulation, so that each pixel unit 100 and the corresponding phase modulation unit 200 form a holographic display unit, and the holographic display unit can perform both the intensity modulation and the phase modulation on the light. In addition, in a plurality of holographic display units including different pixel units and different phase modulation units, each holographic display unit of the plurality of holographic display units can independently modulate the intensity and the phase of passing light. It should be noted that, in order to illustrate a relative positional relationship between the pixel unit 100 in the display panel 1 and the phase modulation unit 200 in the phase modulation panel 2, solid-line rectangular frames used to schematically represent the pixel units 100 and dotted-line rectangular frames used to schematically represent the phase modulation unit 200 are illustrated to have different sizes or areas, but this does not constitute a limitation to the embodiments of the present disclosure. A plane area of the pixel unit of the display panel 1 in the embodiment of the present disclosure and a plane area of the phase modulation unit in the phase modulation unit 2 in the phase modulation panel may be the same or different.

In FIG. 6, description is given by taking an example of the one-to-one correspondence between the plurality of pixel units 100 in the display panel 1 and the plurality of phase modulation units 200 in the phase modulation panel 2. However, the embodiments according to the present disclosure are not limited thereto. For example, a phase modulation unit 200 can correspond to multiple pixel units 100 to perform a uniform phase modulation on the image light emitted by the plurality of pixel units 100 corresponding to each phase modulation unit 200. For example, one phase modulation unit 200 may correspond to one pixel unit, two pixel units, three pixel units or more pixel units.

For example, at least one phase modulation unit of the plurality of phase modulation units 200 in the phase modulation panel 2 is configured to be independently controlled. That is to say, the modulation electrode of at least one phase modulation unit may be applied with voltage different from that of other modulation units, so that degrees of phase modulation of the image light passing through different phase modulation units may be the same or different, and the at least one phase modulation unit may be independent of the other phase modulation units and be applied with phase modulation control signals the same as or different from those of the other phase modulation units. In some examples, each phase modulation unit of the plurality of phase modulation units 200 is configured to be independently controlled. For example, each phase modulation unit may be independent of the other phase modulation units and be applied phase modulation control signals the same as or different from those of the other phase modulation units. For example, the modulation electrode of each phase modulation unit may be independently applied with voltage corresponding to the phase modulation control signal.

Although not illustrated in the figures, a component that prevents crosstalk between the light of adjacent pixel units 100 and the light of adjacent phase modulation units may be provided between adjacent pixel units 100 in the display panel 1 and between adjacent phase modulation units 200 in the phase modulation panel 2. For example, a black matrix may be provided between adjacent pixel units 100 and adjacent phase modulation units 200 to prevent crosstalk between adjacent pixel units or phase modulation units.

The light wave carrying the intensity information modulated by the display panel 1 is incident in the first liquid crystal layer 25, and after being modulated by each phase modulation unit, different phase differences are obtained, that is, the polarization state is changed. In addition, after the light wave passes through the phase modulation panel 2, its intensity is basically not changed. Therefore, the phase modulation panel 2 modulates only the phase of the light wave. By applying different voltages to the modulation electrode 23 and the common electrode 24 of the phase modulation unit 200, the phase modulation panel 2 can realize a continuous change of the phase of the light wave. With reference to FIG. 1, it can be known that starting from the linearly polarized light emitted by the display panel 1, in the case where different phase differences are introduced by each phase modulation unit, the polarization state of the image light is changed, so that it is continuously changed under various polarization states in the elliptical polarized light, the circular polarized light, and elliptical polarized light, the linearly polarized light, the elliptical polarized light, the circular polarized light, the elliptical polarized light, and the linearly polarized light.

It should be noted that the phase modulation panel is on the light-emitting side of the display panel and is configured to perform phase modulation on the linearly polarized image light does not mean that the intensity of the light passing through the phase modulation panel does not change at all, but the phase modulation panel does not individually modulate the intensity of the light passing through the different phase modulation units. For example, the light can pass through different phase modulation units with approximately the same transmittance. Therefore, it can be considered that the phase modulation panel does not modulate the light intensity.

Through the above structure, the phase and the amplitude can be modulated and represented, respectively, and therefore the three-dimensional (3D) display with the high resolution and the high definition can be realized. In addition, the display device can increase the screen size for a dimensional display, and has the simple structure and the low cost.

For example, in some embodiments, the display panel 1 can be a conventional liquid crystal display panel, and the phase modulation panel can be understood as a liquid crystal display panel with the two polarizers used for a polarizer and an analyzer and the color filter removed and other panel structures kept unchanged. For example, any one of the liquid crystal display panel and the phase modulation panel may be a liquid crystal panel with an in-plane switching (IPS) mode, an advanced super dimension field switching (ADS) mode, a vertical alignment (VA) mode, and a twisted nematic (TN) mode, the present disclosure does not specifically limit a specific type of the liquid crystal panel.

Figure 7:
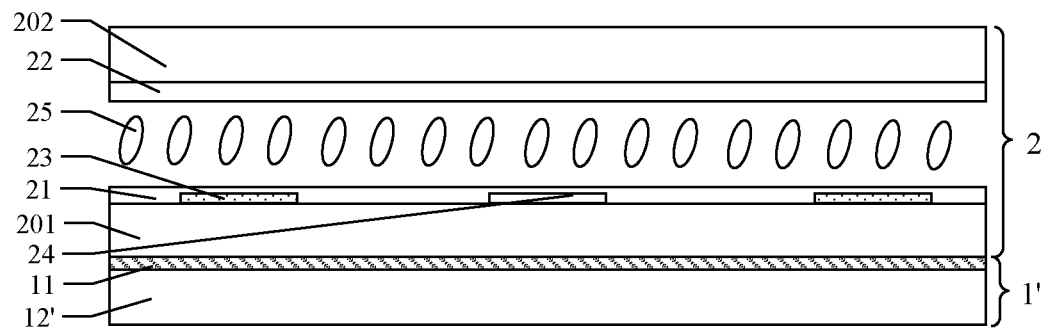
FIG. 7 is a cross-sectional view of a display apparatus according to an embodiment of the present disclosure.

As illustrated in FIG. 7, in another embodiment of the present disclosure, the display panel 1' comprises an organic light emitting diode (OLED) display panel 12' and the first linear polarizer 11. The linear polarizer sheet 11 is arranged on the light-emitting side of the OLED display panel 12'. Different from the above embodiment, the display panel 1 is replaced with an OLED display panel 1'. Because the intensity modulation of the OLED display panel does not require the polarizer, the display panel in this embodiment does not have the second linear polarizer 13 located below and used for the polarizer. However, the light emitted from the display panel needs to be set to have a uniform phase. Therefore, arranging the first linear polarizer 11 on the light emitting side of the OLED display panel can make the image light emitted from the OLED display panel have the uniform phase, so that the phase can be modulated in the phase modulation panel, and the holographic three-dimensional display can be performed.

In addition, the display panel 1' comprises a plurality of pixel units 100, which are arranged in an array. Each pixel unit 100 may comprise at least one light emitting diode. For example, each pixel unit 100 may comprise one light emitting diode. The light emitting diode can emit light waves of different intensities according to the driving signal, so as to realize the intensity modulation of different pixel units. For the pixel units of the OLED display panel, light emitting diodes of different colors may be adopted, and pixel units of different colors may further be formed in a form of white light emitting diodes and color filters. For other arrangement forms of the pixel units in the display panel and the positional relationship between the pixel units and the phase modulation units in the phase modulation panel, reference may be made to the descriptions in the foregoing embodiments, which will not be repeated here.

It should be noted that the OLED display panel mentioned above is an example of an active light-emitting display panel. The display panel according to the embodiments according to the present disclosure may further adopt other types of active light-emitting display panels, for example, a micro LED (light emitting diode) array display panel or a mini LED array display panel.

For example, the structure of the phase modulation panel in this embodiment is the same as that of the phase modulation panel in the embodiment illustrated in FIG. 2, and a specific structure can refer to relevant descriptions in the above embodiments, which will not be repeated here.

In some embodiments of the present disclosure, the plurality of pixel units of the display panel comprise pixel units that emit light of the same color. Thereby, a monochromatic holographic 3D display can be realized.

In some embodiments of the present disclosure, the plurality of pixel units of the display panel comprise pixel units that emit light of different colors, and the pixel units of different colors correspond to different phase modulation units. Thereby, a color holographic 3D display can be realized.

In the embodiment of the present disclosure, the display panel 1 adopting the liquid crystal display panel and the liquid crystal in the liquid crystal layer in the phase modulation panel can use any one or more of the following liquid crystals: nematic liquid crystal, cholesteric liquid crystal and smectic liquid crystal. The embodiments of the present disclosure do not limit the material of the liquid crystal layer.

Figure 8:
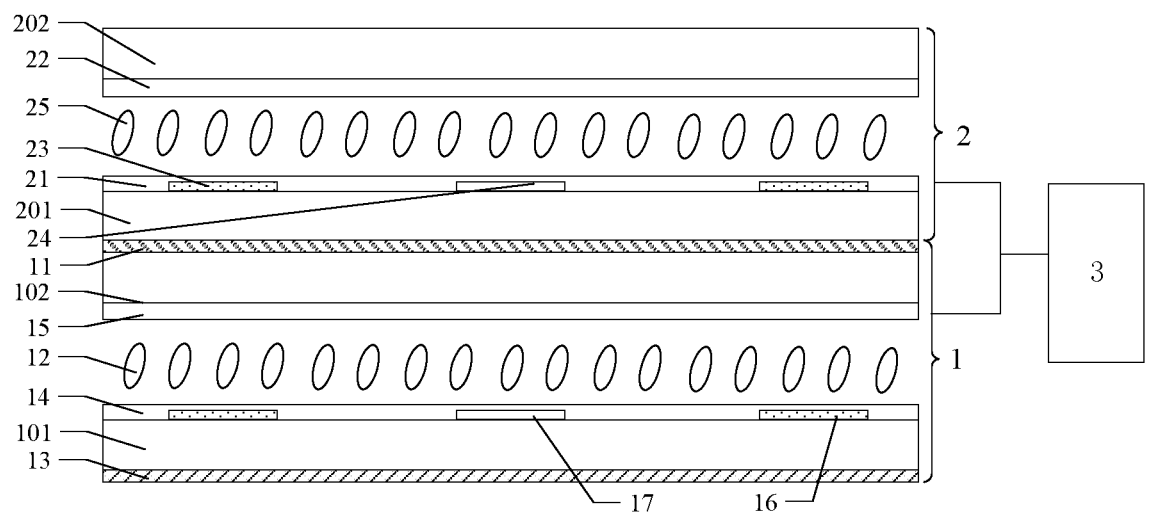
FIG. 8 is a schematic diagram of a holographic display apparatus according to an embodiment of the present disclosure.

The embodiments of the present disclosure further provide a holographic display apparatus. As illustrated in FIG. 8, the holographic display apparatus comprises any one of the display devices in the embodiments mentioned above. FIG. 8 only takes the display panel comprising the liquid crystal display panel as an example for exemplary description, but the embodiments of the present disclosure are not limited thereto. For example, in the holographic display apparatus, in addition to the display apparatus mentioned above, a controller 3 is further provided for controlling the display panel and the phase modulation panel, respectively. For example, the controller 3 is respectively connected to the display panel 1 and the phase modulation panel 2 to provide the display panel 1 with an intensity modulation control signal for display and provide the phase modulation panel 2 with a phase modulation control signal. The controller 3 is schematically illustrated in a form of a square frame in FIG. 8, however, it should be noted that the controller 3 may not be a whole structure. For example, a part of the controller 3 for controlling the display panel 1 may be integrated in the display panel 1, and a part of the controller 3 for controlling the phase modulation panel 2 may be integrated in the phase modulation panel 2. Alternatively, in addition to the part integrated in the display panel 1 and the part integrated in the phase modulation panel 2, a part may be further provided to connect parts other than the above two parts, so as to control operations of the display panel and the phase modulation panel.

For example, the controller 3 may comprise various circuit structures, and the circuit structures may be configured to perform various operational functions described above, which will not be repeated here.

For example, the controller 3 may receive image display information from the outside, and the image display information comprises the intensity information corresponding to the pixel unit and the phase information corresponding to the phase modulation unit. Through the control of the controller, each holographic display unit including the pixel unit and the phase modulation unit can modulate the emitted image light into image light with the intensity information and the phase information. For example, the intensity information of the pixel unit and the phase information corresponding to the phase modulation unit may be the amplitude and the phase information of the object to be displayed obtained according to a digital holographic reconstruction technique described above.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

The foregoing are merely exemplary embodiments of the invention, but is not used to limit the protection scope of the invention. The protection scope of the invention shall be defined by the attached claims.

What is claimed is:

1. A display device, comprising:
a display panel, comprising a first linear polarizer located on a light-emitting side, so that the display panel emits linearly polarized image light with intensity information of object light wave of an object to be displayed; and
a phase modulation panel, disposed on the light-emitting side of the display panel and configured to perform phase modulation on the linearly polarized image light so that the phase modulation panel emits light with the intensity information and phase information of the object light wave of the object to be displayed, for holographic 3D display.

2. The display device according to claim 1, wherein the display panel comprises a plurality of pixel units arranged in an array, the phase modulation panel comprises a plurality of phase modulation units arranged in an array, each phase modulation unit of the plurality of phase modulation units corresponds to at least one pixel unit, so as to modulate phase of the linearly polarized image light emitted by the at least one pixel unit corresponding thereto.

3. The display device according to claim 2, wherein the plurality of phase modulation units and the plurality of pixel units are in a one-to-one correspondence.

4. The display device according to claim 2, wherein the phase modulation panel comprises a first liquid crystal layer, and each phase modulation unit of the plurality of phase modulation units comprises a modulation electrode, which is configured to drive liquid crystal deflection in the first liquid crystal layer to achieve modulation of the phase of the linearly polarized image light passing through the first liquid crystal layer.

5. The display device according to claim 4, wherein the first liquid crystal layer comprises at least one selected from the group consisting of nematic liquid crystal, cholesteric liquid crystal and smectic liquid crystal.

6. The display device according to claim 2, wherein the plurality of pixel units comprise pixel units that emit light of a same color.

7. The display device according to claim 2, wherein the plurality of pixel units comprise pixel units that emit light of different colors, and the pixel units that emit light of different colors correspond to different phase modulation units.

8. The display device according to claim 2, wherein at least one phase modulation unit of the plurality of phase modulation units is configured to be independently controlled.

9. The display device according to claim 8, wherein each phase modulation unit of the plurality of phase modulation units is configured to be independently controlled.

10. The display device according to claim 1, wherein the display panel comprises a liquid crystal display panel, the liquid crystal display panel comprises a second linear polarizer and a second liquid crystal layer, and the second liquid crystal layer is sandwiched between the first linear polarizer and the second linear polarizer.

11. The display device according to claim 10, wherein an absorption axis of the first linear polarizer and an absorption axis of the second linear polarizer are perpendicular to each other.

12. The display device according to claim 10, wherein the second liquid crystal layer comprises at least one selected from the group consisting of nematic liquid crystal, cholesteric liquid crystal and smectic liquid crystal.

13. A holographic display apparatus, comprising the display device of claim 1.

14. The holographic display apparatus according to claim 13, further comprising a controller, connected with the display panel and the phase modulation panel, respectively, and configured to provide the display panel with an intensity modulation control signal and provide the phase modulation panel with a phase modulation control signal.

* * * * *